United States Patent
Kim et al.

(10) Patent No.: US 9,318,352 B2
(45) Date of Patent: Apr. 19, 2016

(54) POWER MODULE PACKAGE AND METHOD FOR MANUFACTURING THE SAME

(71) Applicant: SAMSUNG ELECTRO-MECHANICS CO., LTD., Gyunggi-do (KR)

(72) Inventors: Kwang Soo Kim, Gyunggi-do (KR); Young Ki Lee, Gyunggi-do (KR); Seog Moon Choi, Seoul (KR); Jin Suk Son, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 70 days.

(21) Appl. No.: 13/973,644

(22) Filed: Aug. 22, 2013

(65) Prior Publication Data

US 2013/0337613 A1 Dec. 19, 2013

Related U.S. Application Data

(62) Division of application No. 13/301,616, filed on Nov. 21, 2011, now abandoned.

(30) Foreign Application Priority Data

Jul. 20, 2011 (KR) ........................ 10 2011 0072105

(51) Int. Cl.
*H01L 23/495* (2006.01)
*H01L 25/07* (2006.01)
*H01L 21/50* (2006.01)
(Continued)

(52) U.S. Cl.
CPC .............. *H01L 21/50* (2013.01); *H01L 21/565* (2013.01); *H01L 23/24* (2013.01); *H01L 23/3107* (2013.01); *H01L 23/4334* (2013.01); *H01L 23/49537* (2013.01); *H01L 23/49575* (2013.01); *H01L 23/49586* (2013.01); *H01L 25/072* (2013.01); *H01L 2224/32245* (2013.01); *H01L 2224/48137* (2013.01); *H01L 2224/48247* (2013.01); *H01L 2224/73265* (2013.01); *H01L 2924/1305* (2013.01); *H01L 2924/13055* (2013.01)

(58) Field of Classification Search
None
See application file for complete search history.

(56) References Cited

U.S. PATENT DOCUMENTS

| | | | |
|---|---|---|---|
| 6,734,551 | B2 | 5/2004 | Yoshihara et al. |
| 2003/0075783 | A1 | 4/2003 | Yoshihara et al. |

(Continued)

FOREIGN PATENT DOCUMENTS

| | | |
|---|---|---|
| JP | 2007-184534 | 7/2007 |
| JP | 2010-287753 | 12/2010 |

(Continued)

OTHER PUBLICATIONS

Archived http://en.wikipedia.org/wiki/Sol-gel.*
(Continued)

*Primary Examiner* — Robert Bachner
*Assistant Examiner* — Molly Reida
(74) *Attorney, Agent, or Firm* — Ladas & Parry, LLP

(57) ABSTRACT

Disclosed herein are a power module package and a method for manufacturing the same. The power module package includes first and second lead frames disposed to face each other; ceramic coating layers formed on a portion of a first surface of both or one of both of the first and second lead frames; and semiconductor devices mounted on second surfaces of the first and second lead frames.

9 Claims, 5 Drawing Sheets

(51) Int. Cl.
*H01L 23/433* (2006.01)
*H01L 23/24* (2006.01)
*H01L 23/31* (2006.01)
*H01L 21/56* (2006.01)

(56) References Cited

U.S. PATENT DOCUMENTS

| | | | |
|---|---|---|---|
| 2005/0082690 A1* | 4/2005 | Hayashi et al. | 257/788 |
| 2009/0057698 A1 | 3/2009 | Okamura et al. | |
| 2009/0115038 A1 | 5/2009 | Son et al. | |
| 2010/0133667 A1* | 6/2010 | Oka et al. | 257/666 |
| 2010/0176498 A1 | 7/2010 | Lee et al. | |
| 2011/0097855 A1 | 4/2011 | Otremba | |
| 2011/0121321 A1 | 5/2011 | Kato et al. | |
| 2011/0189821 A1 | 8/2011 | Otremba et al. | |
| 2011/0204500 A1 | 8/2011 | Lim et al. | |
| 2011/0248293 A1 | 10/2011 | Chan et al. | |
| 2012/0043559 A1 | 2/2012 | Hiramatsu | |
| 2012/0061815 A1 | 3/2012 | Sontheimer et al. | |
| 2012/0261705 A1 | 10/2012 | Kim et al. | |
| 2012/0286293 A1 | 11/2012 | Otremba et al. | |

FOREIGN PATENT DOCUMENTS

| | | |
|---|---|---|
| KR | 652444 B1 * | 12/2006 |
| KR | 10-2009-0103599 | 10/2009 |

OTHER PUBLICATIONS

Office Action dated Aug. 21, 2012 for corresponding Korean Patent Application No. 10-2011-0072105 and its English translation provided by the Applicant's foreign counsel.
Final Office Action dated May 22, 2013 for U.S. Appl. No. 13/301,616.
Non-Final Office Action dated Jan. 15, 2013 for U.S. Appl. No. 13/301,616.
Restriction Requirement dated Nov. 21, 2012 for U.S. Appl. No. 13/301,616.

* cited by examiner

POWER MODULE PACKAGE AND METHOD FOR MANUFACTURING THE SAME

CROSS REFERENCE TO RELATED APPLICATION

This application is a divisional application of U.S. patent application Ser. No. 13/301,616, filed on Nov. 21, 2011, which claims priority from Korean Patent Application No. 10-2011-0072105, filed on Jul. 20, 2011, entitled "Power Module Package and Method for Manufacturing the Same", which is hereby incorporated by reference in its entirety into this application.

BACKGROUND OF THE INVENTION

1. Technical Field

The present invention relates to a power module package and a method for manufacturing the same.

2. Description of the Related Art

With the increase in energy consumption around the world, an efficient use of restricted energy has been attracting much attention. Therefore, a use of an inverter adopting an intelligent power module (IPM) for efficiently converting energy in the existing home and industrial appliances has accelerated.

With the increase in the use of the power module, a demand in a market for high-integration, high-capacity, and small-sized products has increased. As a result, a solution for a problem of heat generation from electronic parts has emerged as an important issue.

In particular, when using a high-capacity power device (for example, a high-capacity insulated gate bipolar transistor (IGBT), or the like), heat generated from a high heat generation power device affects a control device that is relatively vulnerable to heat, thereby degrading the entire performance of a module and long-term reliability.

As a result, a need exists for a high heat radiation package structure capable of solving the heat generation problem so as to increase efficiency of a power module and secure high reliability.

SUMMARY OF THE INVENTION

The present invention has been made in an effort to provide a power module package and a method for manufacturing the same capable of improving heat radiation characteristics by forming a ceramic coating layer in the power module package.

According to a preferred embodiment of the present invention, there is provided a power module package, including: first and second lead frames disposed to face each other; ceramic coating layers formed on a portion of a first surface of both or one of both of the first and second lead frames; and semiconductor devices mounted on second surfaces of the first and second lead frames.

The ceramic coating layer may be formed by a sol-gel method.

The semiconductor device may include a power device and a control device, and when the ceramic coating layers are formed on both of the first and second lead frames, the second surface of the first lead frame may be mounted with the power device and the second surface of the second lead frame may be mounted with the control device.

The semiconductor device may include a power device and a control device, and when the ceramic coating layer is formed on the first lead flame, the second surface of the first lead frame may be mounted with the power device and the second surface of the second lead frame may be mounted with the control device.

The power module package may further include a thermal diffusion layer made of a metal material formed on a lower surface of the ceramic coating layer over the first and second lead frames.

Both or one of both of the first and second lead frames may have a down-set structure.

The power module package may further include: a wire electrically connecting between the semiconductor devices or between the semiconductor device and the lead frame; and a molding formed on upper portions of the first and second lead frames, between the first lead frame and the second lead frame, and on a portion of lower portions of the first and second lead frames.

The molding may be formed in a form that exposes the ceramic coating layer formed on the lower portions of the first and second lead frames.

According to another preferred embodiment of the present invention, there is provided a method for manufacturing a power module package, including: preparing first and second lead frames disposed to face each other, forming ceramic coating layers on a portion of a first surface of both or one of both of the first and second lead frames; and mounting semiconductor devices on second surfaces of the first and second lead frames.

At the forming of the ceramic coating layer, the ceramic coating layer may be formed by a sol-gel method.

The semiconductor device may include a power device and a control device, and when the ceramic coating layers are formed on both of the first and second lead frames, at the mounting of the semiconductor device, the second surface of the first lead frame may be mounted with the power device and the second surface of the second lead frame may be mounted with the control device.

The semiconductor device may include a power device and a control device, and when the ceramic coating layer is formed on the first lead frame, at the mounting of the semiconductor device, the second surface of the first lead frame may be mounted with the power device and the second surface of the second lead frame may be mounted with the control device.

The method for manufacturing a power module package may further include: after the mounting of the semiconductor device, forming a wire electrically connecting between the semiconductor devices or between the semiconductor device and the lead frame; and forming a molding so as to cover the upper portion of the semiconductor device mounted between the first and second lead frames, on a portion of lower portions of the first and second lead frames, and upper portions of the first lead frame and the second lead frame.

The method for manufacturing a power module package may further include: prior to forming of the molding, forming a thermal diffusion layer made of a metal material on a lower surface of the ceramic coating layer over the first and second lead frames.

The method may further include: after the forming of the molding, forming forms of the first and second lead frames.

The method for manufacturing a power module package may further include: prior to the forming of the molding, forming a form having a down-set structure on both or one of both of the first and second lead frames.

At the forming of the molding, the molding may be formed in a form that exposes the ceramic coating layers formed on the lower portions of the first and second lead frames.

DESCRIPTION OF THE PREFERRED EMBODIMENTS

Figure 1:
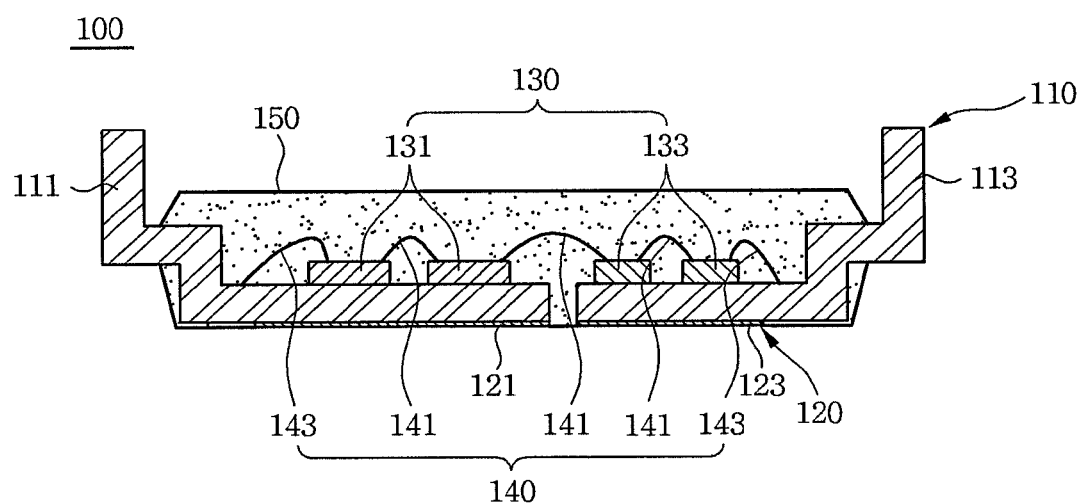
FIG. 1 is a diagram showing a structure of a power module package according to a first preferred embodiment of the present invention.

Various objects, and advantages of the invention will become apparent from the following description of embodiments with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the invention.

The above and other objects, features and advantages of the present invention will be more clearly understood from the following detailed description taken in conjunction with the accompanying drawings. In the specification, in adding reference numerals to components throughout the drawings, it is to be noted that like reference numerals designate like components even though components are shown in different drawings. Further, when it is determined that the detailed description of the known art related to the present invention may obscure the gist of the present invention, the detailed description thereof will be omitted. Terms used in the specification, 'first', 'second', etc. can be used to describe various components, but the components are not to be construed as being limited to the terms.

Hereinafter, preferred embodiments of the present invention will be described in detail with reference to the accompanying drawings.

Power Module Package-First Preferred Embodiment

FIG. 1 is a diagram showing a structure of a power module package according to a first preferred embodiment of the present invention.

As shown in FIG. 1, a power module package 100 may include first and second lead frames 111 and 113 that are disposed to face each other, ceramic coating layers 120, 121, and 123 that are formed on a portion of a first surface of both or one of both of the first and second lead frames 111 and 113, and a semiconductor device 130 that is mounted on second surfaces of the first and second lead frames.

In this configuration, the ceramic coating layers 120, 121, and 123 may be selectively formed only in an area (a bottom of the semiconductor device of FIG. 1) that may generate high heat.

In addition, the ceramic coating layers 120, 121, and 123 may be formed by a sol-gel method that uses low-temperature firing.

In more detail, coating is performed by melting an inorganic body (aluminum oxide ($Al_2O_3$), aluminum nitride (AlN), boron nitride (BN), or the like) in a solvent, together with additives such as a binder component. After the coating is performed, the ceramic coating layers are completed by firing, which uses a baking process at low temperature (200 to 300° C.) to remove the solvent component and the additives such as the binder component.

In this case, a shadow mask, a photo resist (PR), a dry film resist (DFR), a masking tape, or the like, may be applied so as to selectively form the ceramic coating layers 120, 121, and 123 on the first and second lead frames 111 and 113. In addition, a spray method, a bar coating method, or a screen printing method, or the like, may be applied.

Meanwhile, the ceramic coating layers 120, 121, and 123 may be formed to have 10 µm to 1 mm, but the preferred embodiment of the present invention is not limited thereto.

In addition, since the ceramic coating layers 120, 121, and 123 according to the preferred embodiment of the present invention are directly formed on the first and second lead frames 111 and 113 without an adhesive, the heat transfer efficiency may be further improved.

Meanwhile, the semiconductor device 130 may include a power device 131 and a control device 133. For example, the power device 131 may be an insulated gate bipolar transistor (IGBT), a diode, or the like, that may generate high heat and the control device 133 may include a control integrated circuit (IC), or the like, that may generate lower heat that the power device.

As shown in FIG. 1, when the ceramic coating layers 120, 121, and 123 may be formed on both of the first and second lead frames 111 and 113, the power device 131 may be mounted on the second surface of the first lead frame 111 and the control device 133 may be mounted on the second surface of the second lead frame 113.

In addition, both or one of both of the first and second lead frames 111 and 113 may be a down-set structure in a bent form so as to form a step as shown in FIG. 1.

In addition, the power module package 100 may further include wires 140, 141, and 143 that electrically connect between the semiconductor devices 131 and 133 or between semiconductor devices 131 and 133 and the lead frames 110, 111, and 113.

In this configuration, the wire 143 formed between the semiconductor device and the lead frame may be formed between the other lead frame rather than the first and second lead frames equipped with the semiconductor device and the semiconductor device.

This is to previously prevent a short phenomenon generated when the first and second lead frames are electrically connected to the semiconductor device by the wire since the insulating layer is not formed on the second surfaces of the first and second lead frames 111 and 113.

In addition, the power module package 100 may further include a molding 150 that is formed on the upper portions of the first and second lead frames 111 and 113, between the first lead frame 111 and the second lead frame 113, and on a portion of the lower portions of the first and second lead frames 111 and 113.

In this configuration, the molding 150 may be formed in a structure in which the ceramic coating layers 120, 121, and 123 formed on the lower portions of the first and second lead frames 111 and 113 are exposed.

This is to prevent the degradation in the heat radiation characteristics due to the molding material having the lower heat conductivity than the ceramic material of the ceramic coating layer. Due to the structure, the heat radiation characteristics of the power module package according to the preferred embodiment of the present invention may be further improved.

Figure 9:
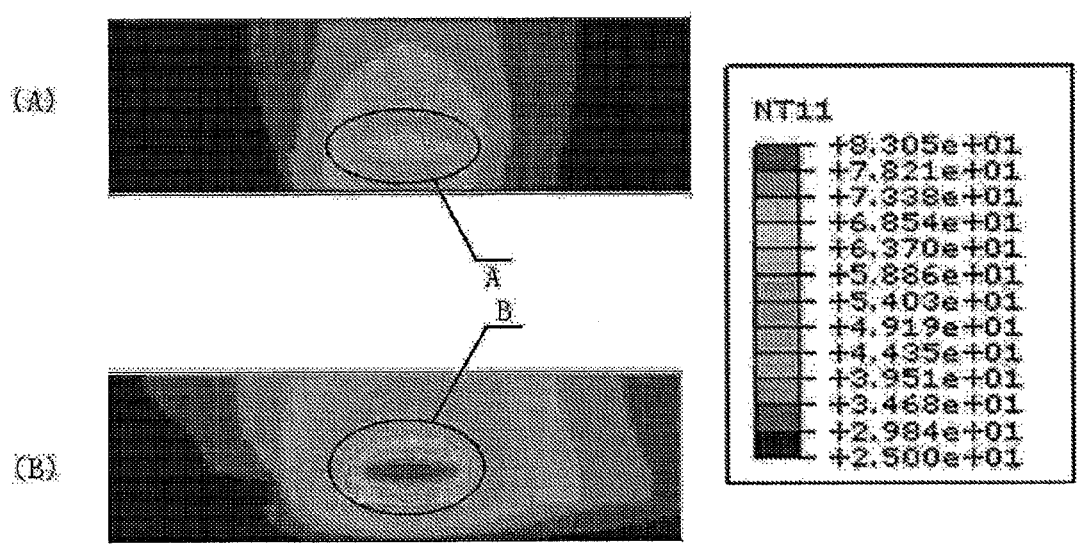
FIG. 9 is a diagram for explaining thermal distribution of the power module package according to the preferred embodiment of the present invention.

FIG. 9 is a diagram thermal distribution of the power module package adopting the ceramic coating layer of the present invention and a general ceramic substrate.

In more detail, FIG. 9A is a diagram showing the thermal distribution around a mounting area (A of FIG. 9A) of the semiconductor device of the power module package to which the ceramic coating layer having a thickness of 100 gm is applied and FIG. 9B is a diagram showing the thermal distribution around the mounting area (B of FIG. 9B) of the semiconductor device of the power module package to which the ceramic substrate having a thickness of 1000 gm is applied. As shown in FIG. 9, as compared with area B (having a value of 8.305e+01, 7.821e+01 in FIG. 9) showing a state in which heat is concentrated since the thermal conductivity around the mounting area of the semiconductor device is not smooth, it can be confirmed that area A (having a value of 6.370e+01, 5.886e+01 in FIG. 9) shows a state in which heat around the mounting area of the semiconductor device is barely concentrated.

As described above, the ceramic coating layers 120, 121, and 123 according to the preferred embodiment of the present invention has higher heat conductivity than the power module package adopting the general ceramic substrate, thereby rapidly emitting heat from the semiconductor device 130 having a large calorific value to the outside.

Meanwhile, the general power module package cannot simultaneously manufacture the ceramic substrate and the lead frame using a high-temperature firing method, the ceramic substrate is manufactured and then, the ceramic substrate is bonded to the lead frame using an adhesive, such that the additional material or process may be required and the heat resistance may be increased.

However, the power module package according to the preferred embodiment of the present invention has a structure in which the ceramic coating layer is directly formed on the lead frame without using an adhesive, thereby further improving the heat radiation characteristics and uses the coating method, thereby reducing the thickness of the power module package.

As shown in FIG. 1, in the present embodiment, the ceramic coating layers 120, 121, and 123 are formed on a surface contacting only the first surfaces of the first and second lead frames 111 and 113 by way of example. However, as shown in FIG. 10, the ceramic coating layers 120 and 125 may also be formed on the first surface and a spaced area between the first and second lead frames 111 and 113.

Figure 10:
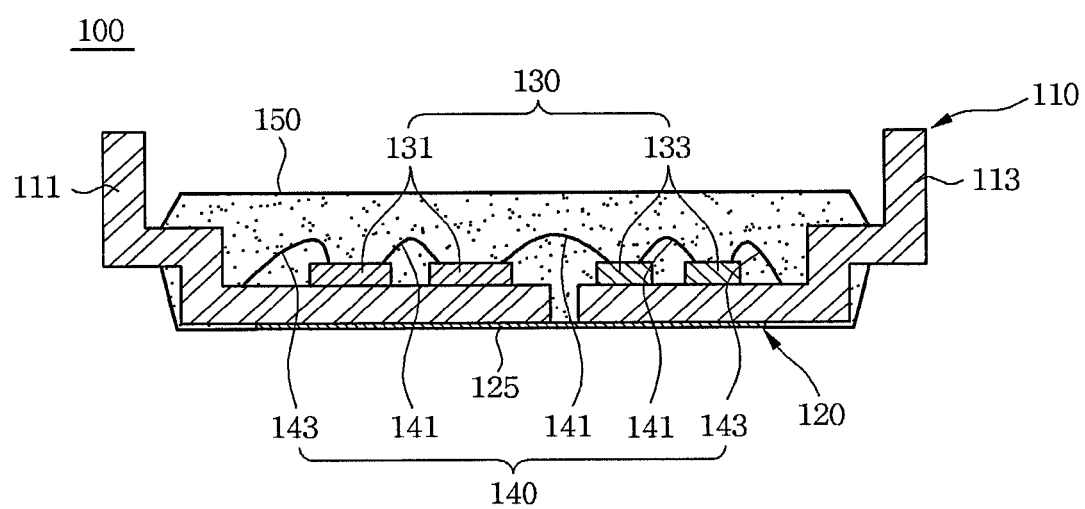
FIG. 10 is a diagram showing a structure of a power module package according to a fourth preferred embodiment of the present invention.

In other words, as shown in FIG. 10, the ceramic coating layers 120 and 125 are also formed on the spaced area between the first and second lead frames 111 and 113.

Power Module Package-Second Preferred Embodiment

Figure 2:
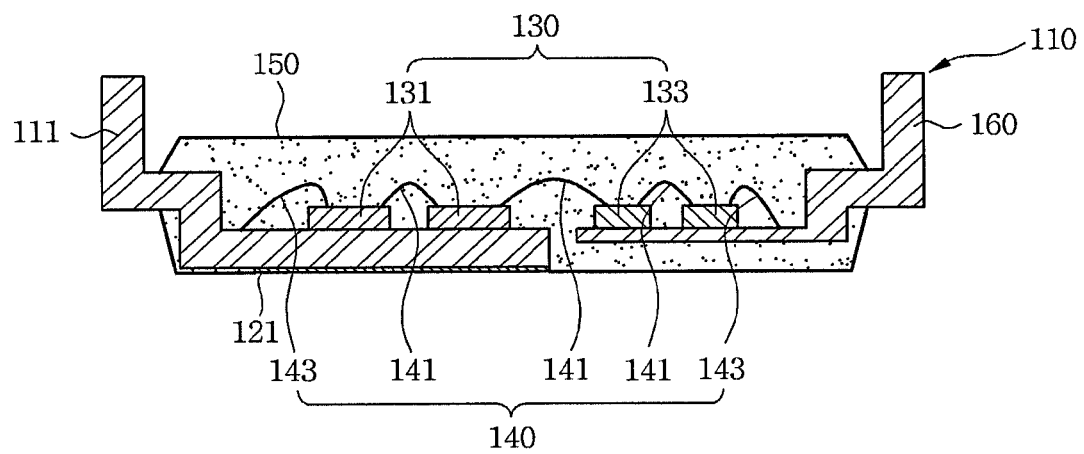
FIG. 2 is a diagram showing a structure of a power module package according to a second preferred embodiment of the present invention.

FIG. 2 is a diagram showing a structure of a power module package according to a second preferred embodiment of the present invention.

However, among components of the second preferred embodiment, a description of the same components as the components of the first preferred embodiment will be omitted, and only the components different therefrom will be described.

As shown in FIG. 2, the power module package 100 may include first and second lead frames 110, 111, and 160 that are disposed to face each other, a ceramic coating layer 121 that is formed on a portion of a first surface of both or one of both of the first and second lead frames 110, 111, and 160, and the semiconductor device 130 that is mounted on second surfaces of the first and second lead frames 110, 111, and 160.

In this configuration, the ceramic coating layer 121 may be formed by the sol-gel method that uses the low-temperature firing.

In addition, the semiconductor device 130 may include the power device 131 and the control device 133. When the first lead frame 111 is formed with the ceramic coating layer 121, the second surface of the first lead frame 111 is mounted with the power device 131 and the second surface of the second lead frame 160 may be mounted with the control device 133.

In this case, the ceramic coating layer 121 is formed on the lower surface of the power device 131 having a larger calorific value than that of the control device 133, which may result in more efficiently emitting heat generated from the power device 131.

In addition, the ceramic coating layer 121 is not formed on the lower portion of the control device 133 having a smaller calorific value than the power device 131, which may result in simplifying the process of manufacturing the power module package and saving the manufacturing costs thereof.

Power Module Package-Third Preferred Embodiment

Figure 3:
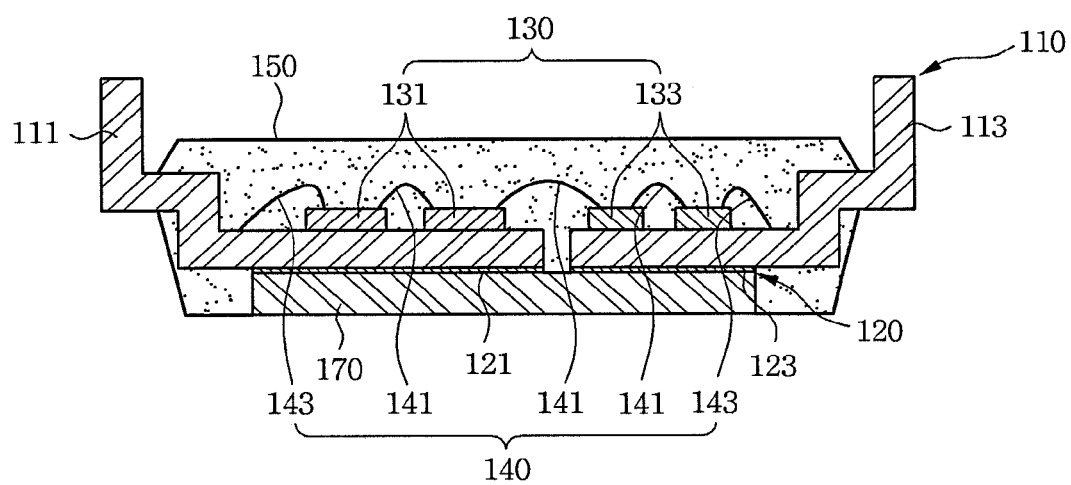
FIG. 3 is a diagram showing a structure of a power module package according to a third preferred embodiment of the present invention.

FIG. 3 is a diagram showing a structure of a power module package according to a third preferred embodiment of the present invention.

However, among components of the third preferred embodiment, a description of the same components as the components of the first preferred embodiment will be omitted, and only the components different therefrom will be described.

As shown in FIG. 3, the power module package 100 may include first and second lead frames 110, 111, and 113 that are disposed to face each other, ceramic coating layers 120, 121, and 123 that are formed on a portion of a first surface of both or one of both of the first and second lead frames 110, 111, and 113, and the semiconductor device 130 that is mounted on second surfaces of the first and second lead frames.

In this configuration, the ceramic coating layer 121 may be formed by the sol-gel method that uses the low-temperature firing.

In addition, the power module package 100 may further include a thermal diffusion layer 170 made of a metal material formed on the lower surfaces of the ceramic coating layers 120, 121, and 123 over the first and second lead frames 110, 111, and 113.

As described above, the structure in which the thermal diffusion layer 170 made of a metal material having high heat conductivity is directly bonded to the lower surfaces of the ceramic coating layers 120, 121, and 123 having high heat conductivity may improve heat radiation characteristics in a horizontal direction as well as a vertical direction that is a thickness direction of the power module package 100 by the thermal diffusion layer 170.

Method for Manufacturing Power Module Package

FIGS. 4 to 8 are process flow charts for explaining a method for manufacturing a power module package according to the first preferred embodiment of the present invention, which will be described with reference to FIGS. 2 and 3.

Figure 4:
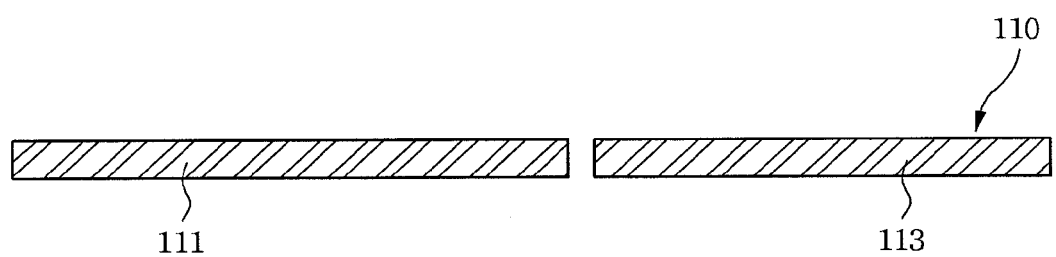
FIGS. 4 to 8 are process flow charts for explaining a method for manufacturing a power module package according to the first preferred embodiment of the present invention.

First, as shown in FIG. 4, the first and second lead frames 110, 111, and 113 that are disposed to face each other is prepared.

Figure 5:
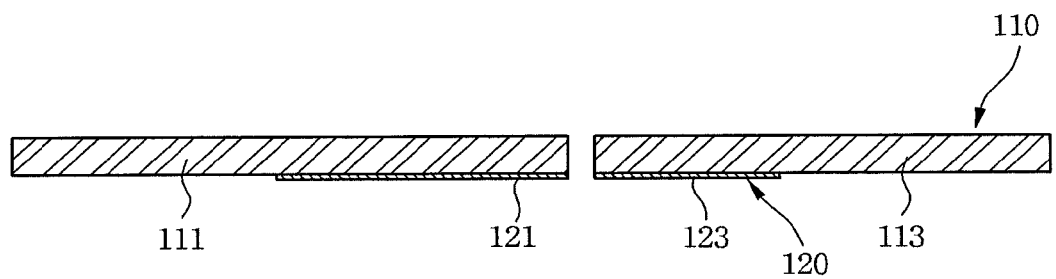

Next, as shown in FIG. 5, the ceramic coating layers 120, 121, and 123 are formed on a portion of the first surface of both or one of both of the first and second lead frames 110, 111, and 113.

In this configuration, the ceramic coating layers 120, 121, and 123 may be formed in an area that corresponds to the lower surface of the area mounted with the semiconductor the device 130 in the fast surface that is the lower surface of the lead frame, that is, only in a portion other than an area bent at the time of forming a form.

The manufacturing costs of the power module package can be saved by forming the selective ceramic coating layer using less ceramic material that is expensive.

In addition, the ceramic coating layer is selectively formed only in a required area in the power module package and thus, a degree of freedom in design of the power module package may be improved.

In addition, the ceramic coating layer is thinly formed by a coating process rather than a plate shape and thus, the thickness and size of the power module package may be reduced.

In addition, the heat radiation characteristics may be further improved due to the structure in which the ceramic coating layer is directly formed on the lead frame without the adhesive.

Meanwhile, the ceramic coating layers 120, 121, and 123 may be formed by the sol-gel method that uses the low-temperature firing.

In more detail, the coating is performed by melting an inorganic body (aluminum oxide ($Al_2O_3$), aluminum nitride (AlN), boron nitride (BN), or the like) in a solvent, together with additives such as a binder component. After the coating is performed, the ceramic coating layers are completed through the firing that uses a baking process at low temperature (200 to 300° C.) to remove the solvent component and the additives such as the binder component In this case, a shadow mask, a photo resist (PR), a dry film resist (DFR), a masking tape, or the like, may be applied so as to selectively form the ceramic coating layers 120, 121, and 123 on the first and second lead frames 111 and 113. In addition, a spray method, a bar coating method, or a screen printing method, or the like, may be applied.

Meanwhile, the ceramic coating layers 120, 121, and 123 may be formed to have 10 μm to 1 mm, but the preferred embodiment of the present invention is not limited thereto.

Figure 6:
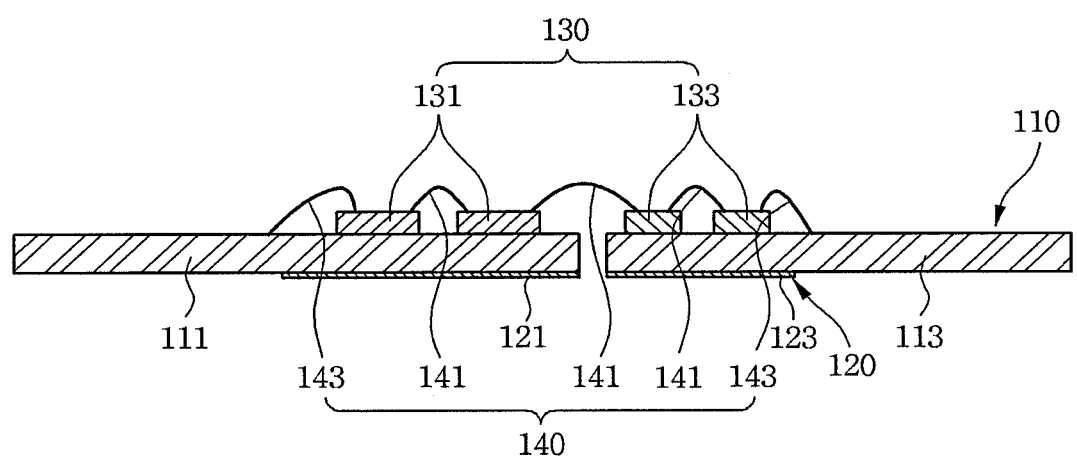

As shown in FIG. 6, the second surfaces of the first and second lead frames 110, 111, and 113 are mounted with the semiconductor device 130.

In this case, the semiconductor device may include the power device 131 and the control device 133.

As shown in FIG. 6, when the ceramic coating layers 120, 121, and 123 are formed on both of the first and second lead frames 111 and 113, the second surface of the first lead frame 111 may be mounted with the power device 131 and the second surface of the second lead frame 113 may be mounted with the control device 133, at the time of mounting the semiconductor device.

In this case, the power device 131 that may generate high heat and the control device 133 that may generate relatively low heat are separately mounted on the first and second lead frames 111 and 113, respectively, thereby minimizing an effect of heat generated from the power device 131 on the control device 133.

In addition, as shown in FIG. 2, when the ceramic coating layer 121 is formed on the first lead frame 111, the second surface of the first lead frame 111 may be mounted with the power device 131 and the second surface of the second lead frame 113 may be mounted with the control device 133, at the time of mounting the semiconductor device.

In this configuration, since the ceramic coating layer 121 is formed on only the lower surface of the first lead frame 111 that is the mounting area of the power device 131 that may generate high heat, heat generated from the power device 131 may be efficiently emitted while simplifying the entire process, including the ceramic coating process and the manufacturing costs and the process may be reduced, Next, the wires 140, 141, and 143 that are electrically connect between the semiconductor devices 131 and 133 or between the semiconductor device 130 and the lead frame may be formed.

In this configuration, the wire 143 formed between the semiconductor device and the lead frame may be formed between the other lead frame rather than the first and second lead frames equipped with the semiconductor device and the semiconductor device.

The reason is that the short phenomenon may be generated when the first and second lead frames are electrically connected to the semiconductor device by the wire since the insulating layer is not formed on the second surfaces of the first and second lead frames 111 and 113.

Figure 7:
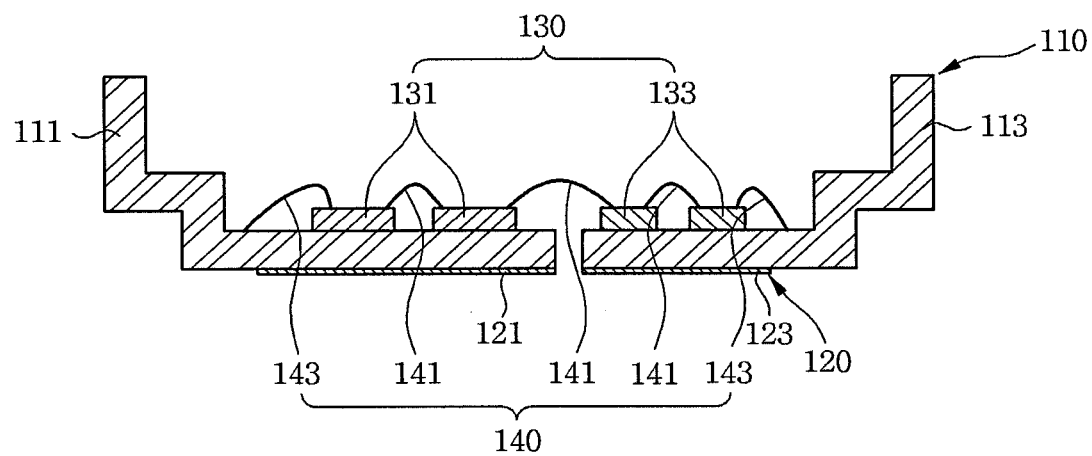

Next, as shown in FIG. 7, the form of the first and second lead frames 111 and 113 may be formed.

In this case, a form having the down-set structure may be formed on both or one of both of the first and second lead frames 111 and 113.

Figure 8:
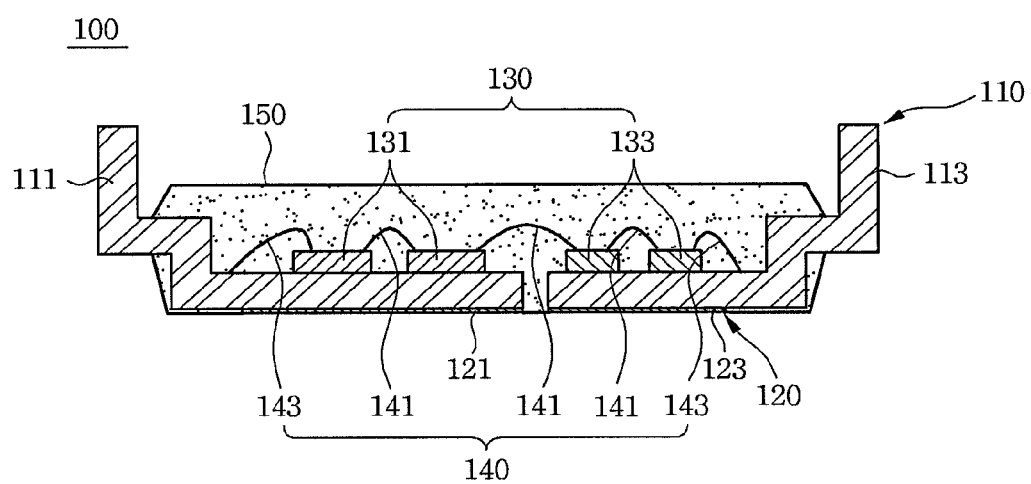

When the down-set structure is not applied to the first and second lead frames 111 and 113, the form of the first and second lead frames 111 and 113 may be formed after the molding forming process of FIG. 8.

Next, as shown in FIG. 8, the molding 150 may be formed to cover the upper portions of the semiconductor device 130, 131, and 133 that are mounted between the first lead frame 111 and the second lead frame 113, a portion of the lower portions of the first and second lead frames 111 and 113, and the upper portions of the first and second lead frames 111 and 113.

In this case, the molding 150 may be formed in a form that exposes the ceramic coating layers 120, 121, and 123 formed on the lower portions of the first and second lead frames 111 and 113.

Meanwhile, as shown in FIG. 3, prior to forming the molding, the thermal diffusion layer 170 made of a metal material may be formed on the lower surfaces of the ceramic coating layers 120, 121, and 123 over the first and second lead frames 110, 111, and 113.

When the thermal diffusion layer 170 is formed, the lower surface of the thermal diffusion layer 170 is formed in the exposed form at the time of forming the molding 150 (see FIG. 3), thereby more efficiently emitting heat As set forth above, the power module package and the method for manufacturing the same according to the present invention can selectively form the ceramic coating layer on the lead frame to shorten the heat emitting path of the semiconductor devices that have a large calorific value and use the ceramic material having the high heat conductivity to improve the heat radiation characteristics.

In addition, the preferred embodiments of the present invention can use the ceramic coating layer to remove the separate heat radiation substrate, thereby simplifying the process of manufacturing the power module package and saving the manufacturing costs thereof, while reducing the thickness and size of the power module package.

Although the preferred embodiments of the present invention have been disclosed for illustrative purposes, they are for specifically explaining the present invention and thus a power module package and a method for manufacturing the same according to the present invention are not limited thereto, but those skilled in the art will appreciate that various modifications, additions and substitutions are possible, without departing from the scope and spirit of the invention as disclosed in the accompanying claims.

Accordingly, such modifications, additions and substitutions should also be understood to fall within the scope of the present invention.

What is claimed is:

1. A method for manufacturing a power module package, comprising:
    preparing first and second lead frames disposed to face each other;
    forming ceramic coating layers on a portion of a first surface of both the first and second lead frames by firing; and
    mounting semiconductor devices on second surfaces of the first and second lead frames,
    wherein the ceramic coating layers are directly formed on the first surface of the first and second lead frames.

2. The method as set forth in claim 1, wherein at the forming of the ceramic coating layer, the ceramic coating layers are formed by a sol-gel method.

3. The method as set forth in claim 1, wherein the semiconductor device includes a power device and a control device, and the second surface of the first lead frame is mounted with the power device and the second surface of the second lead frame is mounted with the control device.

4. The method as set forth in claim 1, further comprising:
    after the mounting of the semiconductor device, forming a wire electrically connecting between the semiconductor devices or between the semiconductor device and the lead frame; and
    forming a molding so as to cover an upper portion of the semiconductor device mounted between the first and second lead frames, on a portion of lower portions of the first and second lead frames, and on upper portions of the first lead frame and the second lead frame.

5. The method as set forth in claim 4, further comprising, prior to forming of the molding, forming a thermal diffusion layer made of a metal material on a lower surface of the ceramic coating layer over the first and second lead frames.

6. The method as set forth in claim 4, further comprising, after the forming of the molding, forming forms of the first and second lead frames.

7. The method as set forth in claim 4, further comprising, prior to the forming of the molding, forming a form having a down-set structure on both or one of both of the first and second lead frames.

8. The method as set forth in claim 4, wherein at the forming of the molding, the molding is formed in a form that exposes the ceramic coating layers formed on the lower portions of the first and second lead frames.

9. The method as set forth in claim 1, wherein the ceramic coating layers are directly formed on the first surface of the lead frames without an adhesive.

* * * * *